(12) United States Patent
Kitagawa et al.

(10) Patent No.: US 6,444,957 B1
(45) Date of Patent: Sep. 3, 2002

(54) HEATING APPARATUS

(75) Inventors: Takao Kitagawa; Masayuki Ishizuka; Kazunori Endou, all of Funabashi; Masayuki Hashimoto; Tsuyoshi Nagata, both of Ichikawa, all of (JP)

(73) Assignee: Sumitomo Osaka Cement Co., Ltd, Tokyo (JP)

( * ) Notice: Subject to any disclaimer, the term of this patent is extended or adjusted under 35 U.S.C. 154(b) by 0 days.

(21) Appl. No.: 09/836,434

(22) Filed: Apr. 16, 2001

(30) Foreign Application Priority Data

Apr. 26, 2000 (JP) .................................. 2000-126587
May 25, 2000 (JP) .................................. 2000-154589

(51) Int. Cl.[7] .......................... H05B 3/68; H05B 3/44; C23C 16/00
(52) U.S. Cl. ................. 219/444.1; 118/725; 219/544
(58) Field of Search ......................... 219/444.1, 468.1, 219/468.2, 543, 544, 546, 547, 548, 552, 553; 118/724, 725; 501/94, 97.2, 98.4, 98.5

(56) References Cited

U.S. PATENT DOCUMENTS

| 2,007,111 | A | * | 7/1935 | Morgan | 219/544 |
| 4,164,442 | A | * | 8/1979 | Bartelmuss | 162/352 |
| 5,314,850 | A | * | 5/1994 | Miyahara | 501/98.4 |
| 5,851,298 | A | * | 12/1998 | Ishii | 219/444.1 |
| 6,139,983 | A | * | 10/2000 | Ohashi et al. | 118/726 |

FOREIGN PATENT DOCUMENTS

| JP | 63271876 A | 11/1988 | ............ H05B/3/20 |
| JP | 06151044 A | 5/1994 | ............ H05B/3/20 |
| JP | 06151332 A | 5/1994 | ......... H01L/21/205 |
| JP | 07135235 A | 5/1995 | ........... H01L/21/60 |
| JP | 11251038 A | 9/1999 | ............ H05B/3/14 |

* cited by examiner

Primary Examiner—Sang Paik
(74) Attorney, Agent, or Firm—Sierra Patent Group, Ltd.

(57) ABSTRACT

The present invention provides a heating apparatus that displays a high heating efficiency and a long product life. In addition, present invention provides a heating apparatus that has no limitations with respect to the materials comprising its heat insulating material, which displays an even greater product life and, moreover, can be manufactured easily at low cost. This heating apparatus is characterized in comprising: a loading plate on which an object to be heated is placed; a support plate that is integrated into a single body with the loading plate; a heating element that is sandwiched in between the loading plate and the support plate; and at least one pair of electrodes, one terminal of which is connected to the aforementioned heating element; wherein, the aforementioned loading plate and support plate each respectively comprises a ceramics sintered body, such that the coefficient of thermal conductivity of the ceramics sintered body comprising the loading plate is greater than the coefficient of thermal conductivity of the ceramics sintered body comprising the support plate. In addition, a heat insulating material may be installed at the base of at least the aforementioned heating element.

10 Claims, 5 Drawing Sheets

HEATING APPARATUS

CLAIM OF PRIORITY

This application claims priority of Japanese Patent Application No. 2000-126587, filed Apr. 26, 2000, and Japanese Patent Application No. 2000-154589, filed May 25, 2000.

BACKGROUND OF THE INVENTION

1. Field of the Invention

The present invention relates to a heating apparatus that is housed within a reaction chamber, which is used for heating an object to be heated, such as a wafer or the like, and is able to achieve marked improvements with respect to both its heating efficiency and product life.

2. Relevant Art

Conventionally, as an example of a heating apparatus that is housed within a reaction chamber and used for heating an object to be heated such as a wafer or the like, a heating apparatus is known, which comprises a heating block that is divided into two parts. Among these two divisions of the aforementioned heating block, the heating block onto which the object to be heated is placed (hereinafter referred to as "loading plate") comprises a material that has a comparatively high coefficient of thermal conductivity, such as stainless steel, iron or the like. The other heating block (hereinafter referred to as "support plate") comprises a material that displays a lower coefficient of thermal conductivity than the material comprising said loading plate, such as ceramics, chinaware, building stone, or the like. In addition, the aforementioned conventional heating apparatus comprises a structure in which a heating element is sandwiched in between the aforementioned loading plate and support plate. In this manner, this heating apparatus is able to heat the aforementioned loading plate by means of concentrating the heat generated by the heating element to the loading plate, and consequently displays a high heating efficiency.

In addition, as another example of a conventional heating apparatus, a heating apparatus is known which comprises a structure in which a single layer or multiple layers of a heat insulating material are provided in between a surface heating member, formed by means of burying a heating element within a ceramics sintered body possessing a superior thermal conductivity, corrosion resistance, and plasma resistance; and a support member, which supports this heating member and connects to a reaction chamber, wherein this heat insulating material limits the heat conducted from the aforementioned surface heating member to said support member.

FIG. 5 is a schematic outline showing the cross-sectional structure of an example of a conventional heating apparatus. The structure of this heating apparatus 1000 will be described in the following. This heating apparatus 1000 comprises a surface heating member 103, a heating element 108, an electrode plate 104, a heat insulating material 113, and a support member 102.

As shown in FIG. 5, heating apparatus 1000 internally comprises a structure in which a single layer of a heat insulating material 113 is sandwiched in between a surface heating member 103, comprising a heating element 108 having a predetermined shape (e.g., spiral-shaped) and a disk-shaped electrode plate 104 for generating plasma, and a support member 102. In this heating apparatus 1000, both the heat insulating material 113 and surface heating member 103, as well as the heat insulating material 113 and support member 102 are joined in an airtight manner.

The surface heating member 103 is equipped with a first ceramics sintered body 103a for holding heating element 108, a second ceramics sintered body 103b for holding electrode plate 104, and a third ceramics sintered body 103c onto which the object to be heated is placed. The first ceramics sintered body 103a and second ceramics sintered body 103b, as well as, the second ceramics sintered body 103b and third ceramics sintered body 103c are respectively joined in an airtight manner by means of bonding layers 110 and 107, each respectively comprising a heat-resistant bonding agent.

In addition, as seen in FIG. 5, heating element 108 is loaded within concave member 112, which is provided along the shape of heating element 108, on the upper surface of the first ceramics sintered body 103a in the figure; and electrode plate 104 is loaded within concave member 111, which is provided on the upper surface of the second ceramics sintered body 103b in the figure.

One pair of heater feeding electrodes 109 is connected to the aforementioned heating element 108, and a high-frequency/direct current voltage application electrode 105 is connected to electrode plate 104. In addition, a thermocouple 106, one terminal of which is inserted into surface heating member 103, is provided in heating apparatus 1000 for measuring the temperature within surface heating member 103.

However, in this type of heating apparatus wherein the loading plate comprises a material that has a comparatively high coefficient of thermal conductivity, such as stainless steel, iron or the like, while the support plate comprises a material that displays a lower coefficient of thermal conductivity than that of the material comprising said loading plate, such as ceramics, chinaware, building stone, or the like, due to the inferior plasma resistance of the stainless steel, iron, etc. comprising the loading plate, there exist problems with respect to the short product life of the heating apparatus.

In addition, in the aforementioned heating apparatus, it is difficult to match the coefficient of thermal expansion of the support plate, which is able to decrease the amount of heat dissipated, and the coefficient of thermal expansion of the loading plate, and thus a difference in these coefficients of thermal expansion inevitably appears. As a result, the durability of the bonding interface between the support plate and the loading plate is insufficient, thereby contributing to the problem of the short product life of this heating apparatus.

In addition, in the construction of the heating apparatus 1000 shown in FIG. 5, problematic restrictions on the structural material of the heat insulating material 113 exist due to the exposure of the side surface of the heat insulating material 113 to the anti-corrosive atmospheric gas, plasma, and the like. As a result, in addition to the restrictions on the structural material of the heat insulating material 113, since it is difficult to approximate the difference in the coefficients of thermal expansion of surface heating member 103 and insulating material 113, or difference in the coefficients of thermal expansion of insulating material 113 and support plate 102, the structure of the aforementioned heating apparatus is extremely complex, leading to a problematic increase in cost.

In order to solve the aforementioned problems, the present invention provides a heating apparatus that displays both a high heating efficiency and a long product life.

Specifically, it is an object of the present invention to provide a heating apparatus comprising a superior plasma resistance, wherein an improvement of the durability of the interface generated by the difference in the coefficients of thermal expansion of the loading plate and support plate is realized while maintaining a high heating efficiency.

In addition, the present invention provides a heating apparatus with a superior heating efficiency, which is free of any restrictions on the structural material of the heat insulating material and is, moreover, easily manufactured at low cost, wherein the product life is further increased.

SUMMARY OF THE INVENTION

In order to achieve the aforementioned objects, the present invention utilizes the following construction.

The present invention provides a heating apparatus characterized in comprising: a loading plate onto which an object to be heated is placed; a support plate that is integrated into a single body with said loading plate; a heating element which is sandwiched in between said loading plate and said support plate; and at least one pair of electrodes, one terminal of which is connected to said heating element; wherein, said loading plate and said support plate each respectively comprises a ceramics sintered body, such that the coefficient of thermal conductivity of said ceramics sintered body comprising said loading plate is greater than the coefficient of thermal conductivity of said ceramics sintered body comprising said support plate.

According to the present invention, since the loading plate and support plate each respectively comprise a ceramics sintered body, it is possible to approximate the values of the coefficients of thermal expansion of the loading plate and support plate, which in turn results in an improvement of the interface strength between the aforementioned, thereby allowing for an increase the durability, plasma resistance, and product life thereof.

In addition, the coefficient of thermal conductivity of the loading plate is greater than the coefficient of thermal conductivity of the support plate, and thus the heat generated from the heating element can be concentrated in the loading plate and transferred therefrom. Furthermore, it is possible to effectively prevent heat dissipation to the support plate, onto to which the object to be heated does not rest, while maintaining the coefficient of thermal conductivity of the side onto which the aforementioned object does rest, and thus dramatically improve the heating efficiency of this heating apparatus.

Subsequently, the present invention provides a heating apparatus characterized in comprising: a loading plate onto which an object to be heated is placed; a support plate that is integrated into a single body with said loading plate; a heating element which is sandwiched in between said loading plate and said support plate; and at least one pair of electrodes, one terminal of which is connected to said heating element; wherein, said loading plate and said support plate each respectively comprises a ceramics sintered body; said heating element is loaded within a concave member provided at the bonding surface of either or both of said loading plate and said support plate; and said heating apparatus is further equipped with a heat insulating material arranged at least at the base of said heating element.

According to the present invention, since the heat insulating material is loaded within a concave member provided at the bonding surface of either or both of the base member and plate to be covered, this heat insulating material is not exposed to anti-corrosive atmospheric gas, plasma, and the like, and thus the structural material comprising this heat insulating material is free of restriction, allowing for an easily manufactured, low cost heating apparatus with a further improved product life.

In addition, the heating apparatus of the present invention is equipped with a heat insulating material arranged at least at the base of said heating element (i.e., the side onto which the object to be heated is not placed), and thus it is possible to prevent dissipation of heat from the side onto which the object to be heated does not rest, while also maintaining the thermal conductivity of the side onto which the object to be heated does rest, which in turn results in a superior heating efficiency.

In addition, in the heating apparatus of the present invention, the heat insulating material is preferably selected from among a metal or ceramics such as aluminum nitride, silicon nitride, a siliceous material, alumina and the like. In the case when the heat insulating material is formed from the aforementioned, it is possible to efficiently insulate the heat generated by means of the heating element.

In addition, in the heating apparatus of the present invention, the ceramics sintered body preferably comprises an aluminum nitride sintered body using $Y_2O_3$ as an auxiliary agent or an aluminum nitride group sintered body using $Y_2O_3$ as an auxiliary agent. By means of employing such a structure, it is possible to reduce the addition amount of the $Y_2O_3$, which in turn allows for easy control of the thermal conductivity of the aluminum nitride group sintered body.

In addition, in the heating apparatus of the present invention, the $Y_2O_3$ blending amount of said ceramics sintered body of said loading plate is preferably greater than the $Y_2O_3$ blending amount of said ceramics sintered body of said support plate.

By constructing the aforementioned loading plate and support plate in this manner, it is possible to reduce the thermal conductivity of the support plate to below that of the loading plate, and also reduce the heat dissipation from the support plate side, onto which the object to be heated does not rest. As a result, it is possible to increase the heating efficiency.

In addition, in the heating apparatus of the present invention, said loading plate and said support plate are preferably bonded together into a single body by means of a vitreous bonding layer. According to this type of structure, it is possible to improve the strength of the bonding surface between the loading plate and support plate, in addition to increasing the degree of air-tightness at the bonding surface of the aforementioned. As a result, by improving the strength of the bonding surface, it is possible to increase the product life of the heating apparatus.

In addition, in the heating apparatus of the present invention, said loading plate comprises a head plate and base plate, which in turn allows for the installation of an electrode plate, sandwiched between said head plate and said base plate, and an electrode, which is connected to said electrode plate. According to this structure, it is possible to apply the aforementioned heating apparatus to various uses by means of varying the usage of the electrode plate.

PREFERRED EMBODIMENTS

In the following, the embodiments of the present invention will be described in detail with reference to the figures. However, these embodiments are for the purpose of more concretely explaining the present invention. Hence, the following embodiments are not particularly limited, and in no manner limit the contents of the present invention.

First Embodiment

Figure 1:
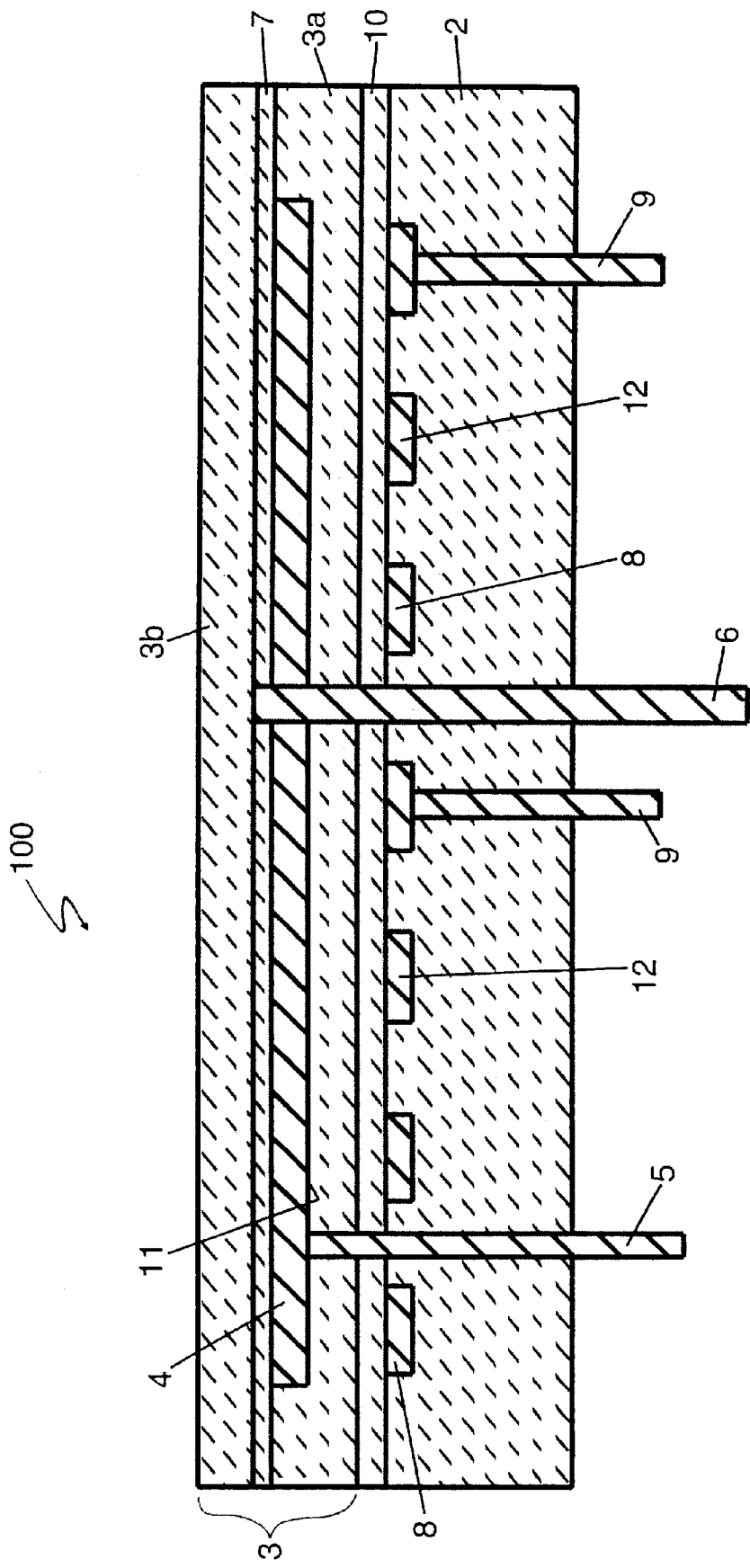
FIG. 1 is a schematic outline showing a cross-sectional view of the structure of the heating apparatus according to a First Embodiment of the present invention.
Figure 2A:
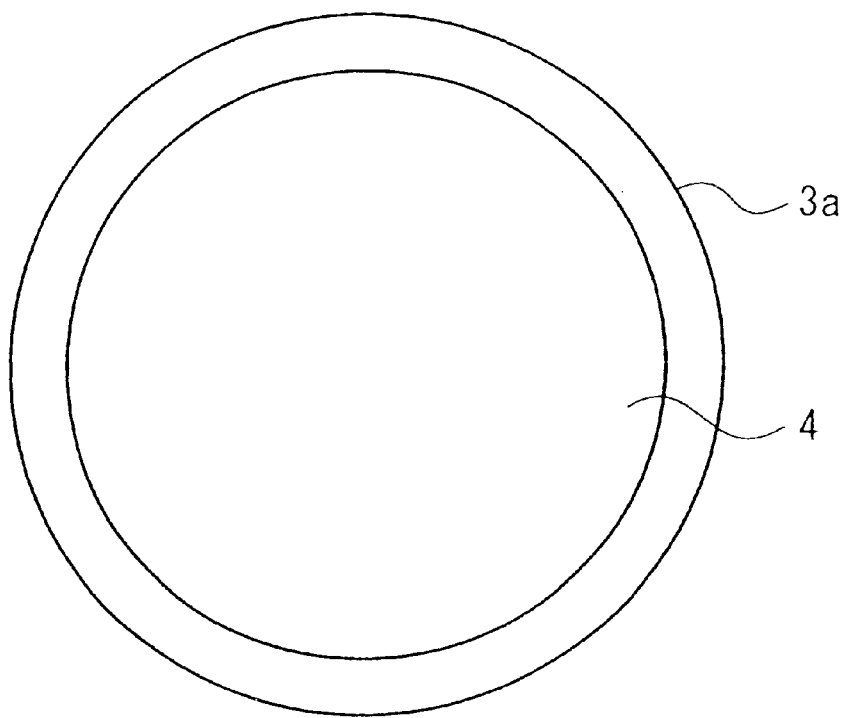
FIG. 2A is a schematic plane view showing the structure of an electrode plate in the heating apparatus according to a First Embodiment of the present invention.
Figure 2B:
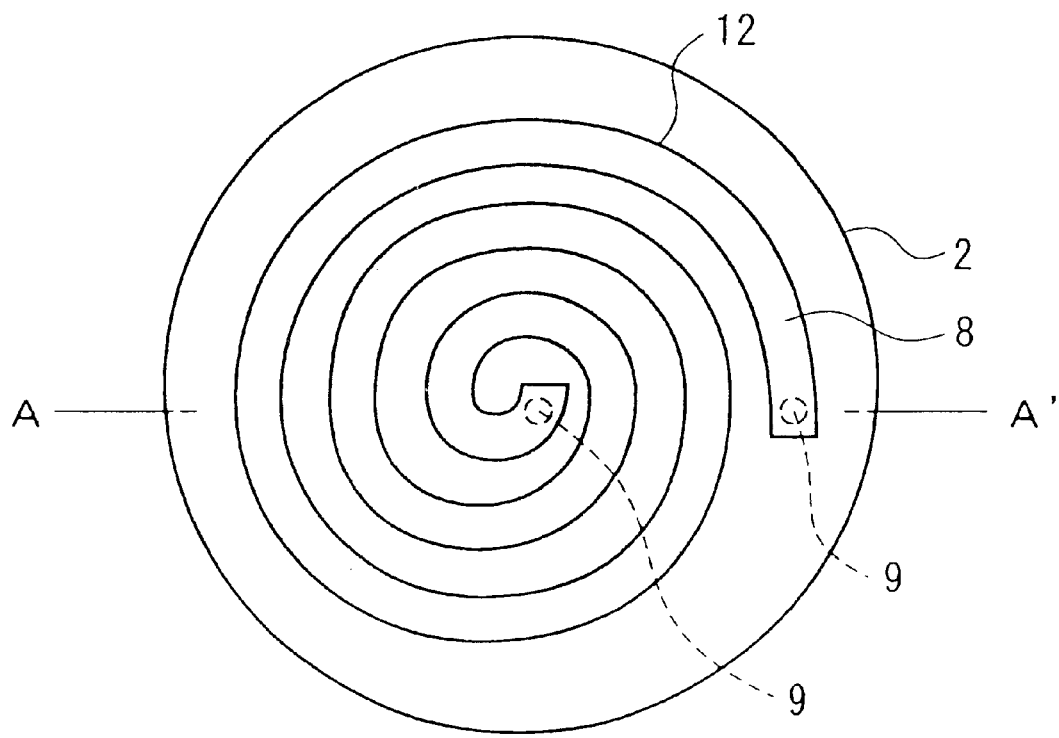
FIG. 2B is a schematic plane view showing the structure of a heating element in the heating apparatus according to a First Embodiment of the present invention.

In the following, the structure of a heating apparatus 100 according to the First Embodiment will be explained based on FIGS. 1, 2A and 2B. FIG. 1 is a schematic cross-sectional diagram of the heating apparatus 100, while FIGS. 2A and 2B are schematic plane views respectively showing the structures of an electrode plate 4 and heating element 8 (concave member 12) of the aforementioned heating apparatus 100. Furthermore, FIG. 2A shows a plane view of a loading base plate 3a (to be explained hereinafter) as seen from the side of the electrode plate 4. FIG. 2B shows a plane view of a support plate 2 (to be explained hereinafter) as seen from the side of the heating element 8. In addition, FIG. 1 shows a cross-sectional view taken along the line A–A' shown in FIG. 2B.

As shown in FIG. 1, heating apparatus 100 comprises a support plate 2 manufactured from a ceramics sintered body in which a concave member 12 having a predetermined shape is provided on the surface thereof; a heating element 8 comprising a predetermined shape which is loaded into the aforementioned concave member 12; a loading plate 3 manufactured from a ceramics sintered body onto which an object to be heated, e.g., wafer or the like, is placed, which covers the entire region of the support plate 2 and heating element 8; at least one pair of heater feeding electrodes 9, one terminal of which is connected to heating element 8; and a thermocouple 6 for measuring the temperature of loading plate 3 onto which the object to be heated is placed. The aforementioned support plate 2 and loading plate 3 are bonded together into a single body by means of a first bonding layer 10, which is formed from a heat-resistant bonding agent.

Furthermore, in FIGS. 1, 2A and 2B, the following are shown as an example: support plate 2 and loading plate 3 each respectively comprise a disk shape; concave member 12 and heating element 8 are arranged in a spiral manner from the center portion of support plate 2 towards the periphery; and the pair of heater feeding electrodes 9 is connected to both terminal portions of heating element 8.

In addition, as shown in FIG. 1, loading plate 3 comprises a loading base plate 3a manufactured from a ceramics sintered body in which a concave member 11 is provided on the upper surface thereof; an electrode plate 4 manufactured from a metal or a composite conductive material of metal and ceramic, which is loaded within concave member 12; a loading head plate 3b manufactured from a ceramics sintered body which covers the entire region of loading base plate 3a and electrode plate 4; high-frequency/direct current voltage application electrode 5, one terminal of which is connected to electrode plate 4; and thermocouple 6, one terminal of which is inserted within loading plate 3 for measuring the temperature of loading plate 3. As shown in FIG. 2A, electrode plate 4 may be formed, for example, in a disk shape.

In addition, the aforementioned support plate 2 and loading base plate 3a are bonded together in an airtight manner by means of a first bonding layer 10, which is formed from a heat-resistant bonding agent.

With regard to loading plate 3, loading base plate 3a and loading head plate 3b are bonded together by means of a second bonding layer 7, which is formed from a material having the same composition or having the same main component as the material comprising either loading base plate 3a or loading head plate 3b.

In addition, high-frequency/direct current voltage application electrode 5 and heater feeding electrodes 9 are formed from a metal having a superior heat resistance such as nickel, tungsten, tantalum, or the like.

Furthermore, as shown in FIG. 1, high-frequency/direct current voltage application electrode 5, heater feeding electrodes 9, and thermocouple 6 all penetrate into support plate 2, extending down to the base of this support plate 2.

In the following, the structural elements comprising the heating apparatus 100 of the present embodiment will be respectively explained.

[Loading Plate]

Examples of the material comprising loading base plate 3a and loading head plate 3b may include ceramics sintered bodies such as an aluminum nitride sintered body, aluminum nitride group sintered body, magnesium oxide sintered body, boron nitride sintered body, and the like. Among the aforementioned, an aluminum nitride sintered body or aluminum nitride group sintered body are particularly preferred due to their superior conductivity and mechanical strength, in addition to a superior durability with respect to plasma cleaning gases, such as $CF_4$, $C_2F_6$, $C_2F_8$ and the like. The aforementioned aluminum nitride sintered body and aluminum nitride group sintered body may be manufactured according to known conventional methods.

In order to increase the degree of sintering and improve the plasma resistance, the aforementioned aluminum nitride group sintered body may be prepared, for example, by means of adding a total of approximately 0.1~20% by weight of at least one additive selected from among $Y_2O_3$, CaO, MgO, SiC and $TiO_2$.

However, in the present embodiment, in order to control the thermal conductivity of loading base plate 3a and loading head plate 3b, the aluminum nitride group sintered body in which $Y_2O_3$ is used as an auxiliary agent is particularly preferred as the material for the aforementioned loading base plate 3a and loading head plate 3b.

[Support Plate]

Examples of the material comprising support plate 2 may include ceramics sintered bodies such as an aluminum nitride sintered body, aluminum nitride group sintered body, magnesium oxide sintered body, boron nitride sintered body, and the like. Among the aforementioned, an aluminum nitride sintered body or aluminum nitride group sintered body are preferred due to their superior conductivity and mechanical strength, in addition to a superior durability with respect to plasma cleaning gases, such as $CF_4$, $C_2F_6$, $C_2F_8$ and the like. Furthermore, an aluminum nitride sintered body or aluminum nitride group sintered body having a smaller coefficient of thermal conductivity than that of the aluminum nitride sintered body or aluminum nitride group sintered body comprising the aforementioned loading base plate 3a and loading head plate 3b is particularly preferred.

Similarly, the ceramics sintered body comprising support plate 2 preferably has a smaller coefficient of thermal conductivity than that of the ceramics sintered body comprising loading plate 3. In this manner, the coefficient of thermal conductivity of loading plate 3 is higher than the coefficient of thermal conductivity of support plate 2, which in turn allows heat generated by heating element 8 to be concentrated on loading plate 3. Accordingly, it is possible to efficiently increase the temperature of the loading plate 3, and as a result increase the heating efficiency of the heating apparatus 1. In this manner, it is possible to easily reduce in the amount of heat dissipated from the base of heating element 8 to support plate 2.

In addition, the aforementioned support plate 2, loading base plate 3a and loading head plate 3b are preferably formed from an aluminum nitride group sintered body in which $Y_2O_3$ is used as an auxiliary agent, wherein the blending amount of $Y_2O_3$ in the sintered body comprising loading base plate 3a and loading head plate 3b is preferably set to greater than the blending amount of $Y_2O_3$ in the sintered body comprising the support plate 2 for the following reason.

By means of increasing and decreasing the addition amount of $Y_2O_3$ within the range of 0~20% by weight, and preferably 0~15% by weight, it is possible to easily control the thermal conductivity of the aluminum nitride group sintered body. Here, by setting the blending amount of $Y_2O_3$ in the sintered body comprising loading base plate 3a and loading head plate 3b to greater than the blending amount of $Y_2O_3$ in the sintered body comprising the support plate 2, it is possible to reduce the thermal conductivity of the support plate 2 to less than those of loading base plate 3a and loading head plate 3b. In this manner, it is possible to decrease the amount of heat dissipated from the bottom of the heating element, i.e., from the side of support plate 2, on which the object to be heated does not rest. As a result, it is possible to increase the heating efficiency of the heating apparatus 100.

Furthermore, the coefficient of thermal expansion of the aluminum nitride group sintered body remains for the most part constant, even when increasing or decreasing the amount of $Y_2O_3$, and thus it is possible to maintain the durability of the bonding interface (first bonding layer) between the support plate 2 and loading base plate 3a even when faced with the added load of a heat cycle temperature rise or fall. Accordingly, it is possible to increase the product life of the heating apparatus 100.

[Heating Element]

As the material for the aforementioned heating element 8, a silicon carbonate sintered body, which is sintered without the addition of any additives and comprises a sintered density of at least $2.8 \times 10^3$ kg/m$^3$, and an electrical resistance at room temperature of less or equal to $0.1 \times 10^{-2}$ Ωm is preferred.

In addition, heating element 8 is not joined to either support plate 2 (concave member 12) or the first bonding layer 10 (loading base plate 3a), such that an interval space exists between heating element 8 and concave member 12, and between heating element 8 and first bonding layer 10 (loading base plate 3a), respectively (not shown in the figure).

In addition, since the material of heating element 8 comprises a silicon carbonate sintered body (coefficient of thermal expansion=$3.7 \times 10^{-6}$/°C.), it is possible to approximate the coefficient of thermal expansion ($3.8 \times 10^{-6}$~$4.7 \times 10^{-6}$/°C.) of the aluminum nitride sintered body or aluminum nitride group sintered body comprising support plate 2.

By means of providing this type of heating element, it is possible to drastically improve the durability of the first bonding layer 10 joining the loading base plate 3a and support plate 2, since there is no generation of thermal stress, which causes differences in the coefficients of thermal expansion between the heating element 8 and support plate 2, and between the heating element 8, first bonding layer 10 and loading base plate 3a.

Subsequently, by means of energizing this heating element 8, it is possible to maintain the loading plate at a predetermined temperature.

This type of heating element comprising a silicon carbonate sintered body may be manufactured, for example, according to the following method disclosed in Japanese Patent Application, First Publication No. Hei 4-65361.

Manufacturing method (1): An elemental gas comprising a first silicon carbonate powder having an average particle diameter of $0.1$~$10 \times 10^{-6}$ m ($0.1$~$10$ μm) and a silane compound within plasma in a non-oxidizing atmosphere, or a halogenated silicon and hydrogen carbonate, and is introduced and mixed with a second silicon carbonate powder having an average particle diameter of no greater than $0.1 \times 10^{-6}$ m ($0.1$ μm), which has been prepared by means of a gas phase reaction in which the reaction pressure is controlled within a range of 101 kPa or less to 13 Pa (0.1 Torr). The mixture is then heated and sintered to yield a silicon carbonate sintered body. This sintered body subsequently is processed according to a predetermined pattern via an electric discharge machine to produce a heating element 8.

In addition, the heating element 8 may also be manufactured, for example, according to the following method disclosed in Japanese Patent Application, First Publication No. Hei 4-65361.

Manufacturing method (2): A silicon carbonate sintered body is first obtained by means of mixing, heating and sintering an elemental gas comprising a silane compound within plasma in a non-oxidizing atmosphere, or a halogenated silicon and hydrogen carbonate, and a second silicon carbonate powder having an average particle diameter of no greater than $0.1 \times 10^{-6}$ m ($0.1$ μm), which has been prepared by means of a gas phase reaction in which the reaction pressure is controlled within a range of 101 kPa or less to 13 Pa (0.1 Torr). This sintered body subsequently is processed according to a predetermined pattern via an electric discharge machine to produce a heating element 8.

The heating element 8 obtained by means of either of the aforementioned processes is hence rendered additive free. In other words, the heating element is a homogenous material formed from a silicon carbonate sintered body, which has been sintered without the addition of any foreign substance, and thus there is no partial generation of abnormal heat. As a result, it is possible to prevent the occurrence of leaks in the first bonding layer 10 from melting of a portion of this first bonding layer 10, and thus also further strengthen and maintain the degree of air-tightness of the aforementioned first bonding layer 10.

In addition, since the aforementioned heating element 8 remains free of any additives and is hence extremely pure, and also comprises a high density sintered body having a sintered density of at least $2.8 \times 10^3$ kg/m$^3$, even if the air-tightness of the first bonding layer 10 is compromised by means of a leak, there is no fear of contamination within the reaction chamber because evaporation of impurities from the heating element, which is caused by additives, does not occur.

Furthermore, since the heating element 8 also comprises a superior heat resistance, distortion, burnout and the like of the heating element 8 due to thermal shock does not occur.

In addition, the electrical resistance of heating element 8 at a constant temperature comprises a low electrical resistance value of no greater than $0.1 \times 10^{-2}$ Ωm, and thus narrowing or thinning of the heating element 8 is not necessary, such that fear of burning out the heating element 8 does not exist.

[Electrode Plate]

The electrode plate 4 preferably comprises a material having a coefficient of thermal expansion close to that of the loading base plate 3a and loading head plate 3b, for example, a high-melting point metal such as molybdenum, tungsten, tantalum, niobium, or alloys of the same; or a conductive composite of a high-melting point metal and ceramic. According to this type of electrode plate, both the heat processing temperature and atmosphere at the time of bonding loading base plate 3a and loading head plate 3b remains stable with a low intrinsic resistance, such that use over a long period of time within a practical temperature region ranging from room temperature to 1000° C. is possible.

This electrode plate 4 may be used as an electrode for use in an electrostatic chuck, heater electrode, plasma generating electrode, and the like.

Hence, plasma can be generated by means of applying a high-frequency voltage from a plasma generating source (not shown in the figures) via a high-frequency/direct current voltage application electrode 5. At this time, the electrode plate 4 preferably comprises a sufficient thickness of at least $0.01 \times 10^{-3}$ m (0.01 mm). Accordingly, when providing an electrode plate 4 of these specifications, there is no fear of hardening and tearing even when applying high-frequency voltage and heating thereon. In addition, in contrast to the case when using a grating or mesh-shaped electrode, it is possible to precisely, stably and uniformly generate plasma over an entire area, with the advantage of also executing without fail the connection of electrode plate 4 and high-frequency/direct current voltage application electrode 5 between the surface/rod.

In addition, when applying a direct current high voltage of approximately 500V to the electrode plate 4 from an electrostatic chuck power source (not shown in the figures) via the aforementioned high-frequency/direct current voltage application electrode 5, loading plate 3 functions as an insulating body, and allows for the electrostatic absorption of an object to be heated, e.g., a wafer or the like on loading plate 3.

Furthermore, in the case when applying both high-frequency voltage from a plasma generating power source and direct current high voltage from an electrostatic chuck power source to the aforementioned electrode plate 4, a filter capable of high-frequency blockade may be arranged between the aforementioned electrostatic chuck power source and heater feeding electrodes 9.

[First Bonding Layer]

The first bonding layer 10 preferably comprises a heat-resistant bonding agent, for example, a bonding agent comprising at least two elements selected from the elements of Group IIIa of the Periodic Table, aluminum, and silicon; a bonding agent comprising at least one element selected from the elements of Group IIIa of the Periodic Table, and aluminum; a bonding agent comprising at least one element selected from the elements of Group IIIa of the Periodic Table; and a bonding agent comprising at least one element selected from the elements of Group IIIa of the Periodic Table, aluminum, silicon, and at least one element selected from the elements of Group IIIa of the Periodic Table. More preferably, the aforementioned first bonding layer 10 comprises an oxynitride glass layer containing a bonding agent comprising at least two elements selected from the elements of Group IIIa of the Periodic Table, aluminum, and silicon.

The first bonding layer 10 comprising an oxynitride glass layer containing a bonding agent comprising at least two elements selected from the elements of Group IIIa of the Periodic Table, aluminum, and silicon displays a dramatically improved degree of air-tightness, which can be maintained over a long period of time. The reason for this aspect will be explained in the following.

The oxynitride glass layer possessing the aforementioned components has an excellent wettability with a ceramics sintered body and a superior bonding strength, and hence the first bonding layer 10 displays an excellent air-tightness with little dispersion, and a superior heat resistance.

In addition, the coefficient of thermal expansion of the oxynitride glass layer possessing the aforementioned components is $3 \times 10^{-6} \sim 8 \times 10^{-6}/°C.$, which approximates the coefficient of thermal expansion ($3.8 \times 10^{-6} \sim 4.7 \times 10^{-6}/°C.$) of the aluminum nitride sintered body or aluminum nitride group sintered body. Consequently, it is possible to avoid damage of the first bonding layer 10, i.e., generation of cracks, from repeated temperature elevation and reduction at the time of thermal loading, and thus it is also possible to maintain the air-tightness of the first bonding layer 10 over a long period of time.

In addition, the glass softening point (Tg) of the oxynitride glass layer possessing the aforementioned components is high at 850~950° C., and thus degradation of the first bonding layer 10 does not occur, even when exposing the heating apparatus 100 to a high temperature atmosphere for a long period of time.

In addition, according to the present embodiment, the thickness of the first bonding layer 10 is preferably $5 \sim 180 \times 10^{-6}$ m (5~180 μm). The reason that a first bonding layer 10 having a thickness of $5 \sim 180 \times 10^{-6}$ m (5~180 μm) is preferred will be explained in the following, however, this aspect also allows for further stable maintenance of the air-tightness of the first bonding layer 10.

A thickness of the first bonding layer 10 of less than $5 \times 10^{-6}$ m (5 μm) results in an inability to maintain the air-tightness of the first bonding layer 10 and an insufficient bonding strength due to inadequate formation of the fillet at a terminal portion of the first bonding layer 10. On the other hand, a thickness of the first bonding layer 10 exceeding $180 \times 10^{-6}$ m (180 μm) results in the ability to maintain the air-tightness of the first bonding layer 10, but also leads to easy degradation of the bonding strength. In addition, at the time of forming the first bonding layer 10, the bonding agent, which is melted during the heating process, flows out and makes it impossible to join the support plate 2 and loading base plate 3a in parallel. Consequently, this leads to fear of a decrease in the yield of the product, and possible hindrance to the bonding operation.

[Second Bonding Layer]

As described in the aforementioned, loading base plate 3a and loading head plate 3b, which comprise loading plate 3, are bonded together by means of a second bonding layer 7, which is formed from a heat-resistant bonding agent, e.g., material having the same composition or the same main component as the material comprising either loading base plate 3a or loading head plate 3b.

For example, when either loading base plate 3a or loading head plate 3b comprise aluminum nitride, the aluminum nitride powder is inserted in between loading base plate 3a and loading head plate 3b, at the bonding surface, without the incorporation of another bonding agent. As a result, it is possible to join loading base plate 3a and loading head plate 3b, via a second bonding layer 7 comprising aluminum nitride, by means of applying high-temperature pressure to the aforementioned loading base plate 3a and loading head plate 3b.

The heat-processing atmosphere at the time of inserting the aluminum nitride powder in between loading base plate 3a and loading head plate 3b, at the bonding surface, and applying high-temperature pressure to the aforementioned loading base plate 3a and loading head plate 3b, preferably comprises an inactive atmosphere such as a vacuum, Ar gas, He gas, $N_2$ gas, or the like. In addition, the approximate amount of pressure applied is preferably 2.45~19.6 Mpa (25~200 $kg/cm^2$), while a heat-processing temperature of approximately 1400~2000° C. is preferred.

Furthermore, in the present embodiment, the term "material having the same main component" refers to a material in which the contents of components other than the material comprising the aforementioned loading base plate 3a or loading head plate 3b is no greater than 50 mol %, e.g., when aluminum nitride comprises loading base plate 3a or loading head plate 3b, the content of components other than the aluminum nitride is no greater than 50 mol %.

In addition, according to the present embodiment, the thickness of the second bonding layer 7 is preferably 5~180× $10^{-6}$ m (5~180 μm). The reason that a second bonding layer 7 having a thickness of 5~180×$10^{-6}$ m (5~180 μm) is preferred will be explained in the following, however, this aspect also allows for further stable maintenance of the air-tightness of the second bonding layer 7.

A thickness of the second bonding layer 7 of less than 5×$10^{-6}$ m (5 μm) results in an inability to maintain the air-tightness of the second bonding layer 7 and an insufficient bonding strength due to inadequate formation of the fillet at a terminal portion of the second bonding layer 7. On the other hand, a thickness of the second bonding layer 7 exceeding 180×$10^{-6}$ m (180 μm) results in the ability to maintain the air-tightness of the second bonding layer 7, but also leads to easy degradation of the bonding strength. In addition, at the time of forming the second bonding layer 7, the bonding agent, which is melted during the heating process, flows out and makes it impossible to join the support plate 2 and loading base plate 3a in parallel. Consequently, this leads to fear of a decrease in the yield rate of the product, and possible hindrance to the bonding operation.

According to the heating apparatus 100 having the aforementioned structure of the present embodiment, both the loading plate 3 and support plate 2 are formed from ceramics sintered bodies, which in turn leads to a superior plasma resistance and the ability to approximate the coefficients of thermal expansion. Consequently, it is possible to improve the durability of the bonding surface at the interface of the aforementioned, and thereby increase the product life. In addition, the coefficient of thermal conductivity of loading plate 3 is set higher than the coefficient of thermal conductivity of support plate 2. Thus, it is possible to improve the thermal conductivity from heating element 8 to loading plate 3, and thereby also improve the heating efficiency of the heating apparatus 100.

In addition, the control of the coefficients of thermal conductivity is accomplished by means of modifying the addition amount of $Y_2O_3$ of each ceramics sintered body, such that this control can be easily executed without changing the coefficients of thermal expansion of the aforementioned loading plate 3 and support plate 2.

In addition, the aforementioned loading plate 3 and support plate 2 are bonded by means of a bonding layer 10, which improves the air-tightness, and results in a superior strength, plasma resistance and the like at the bonding surface of the aforementioned. In this manner, it is possible to increase the product life of the heating apparatus 1.

[Second Embodiment]

In the following, the Second Embodiment of the present invention will be explained with reference to FIG. 3. The basic structure of the heating apparatus of the present embodiment is the same as that of heating apparatus 100 of the aforementioned First Embodiment. The only differences are that the concave member 12a provided in support plate 2 is formed in a manner such that it is deeper than the concave member 12 shown in FIG. 1, and a heat insulating material is provided at the base of the heating element installed in this concave member 12a. Consequently, in FIG. 3, the structural components that are identical to those of the aforementioned heating apparatus 100 will be denoted by the same numeral and their explanations will be omitted. In addition, the plane structures of electrode plate 4 and heating element 8 of heating apparatus 200 are identical to those shown in FIGS. 2A and 2B, respectively, and hence their drawings will be omitted.

Figure 3:
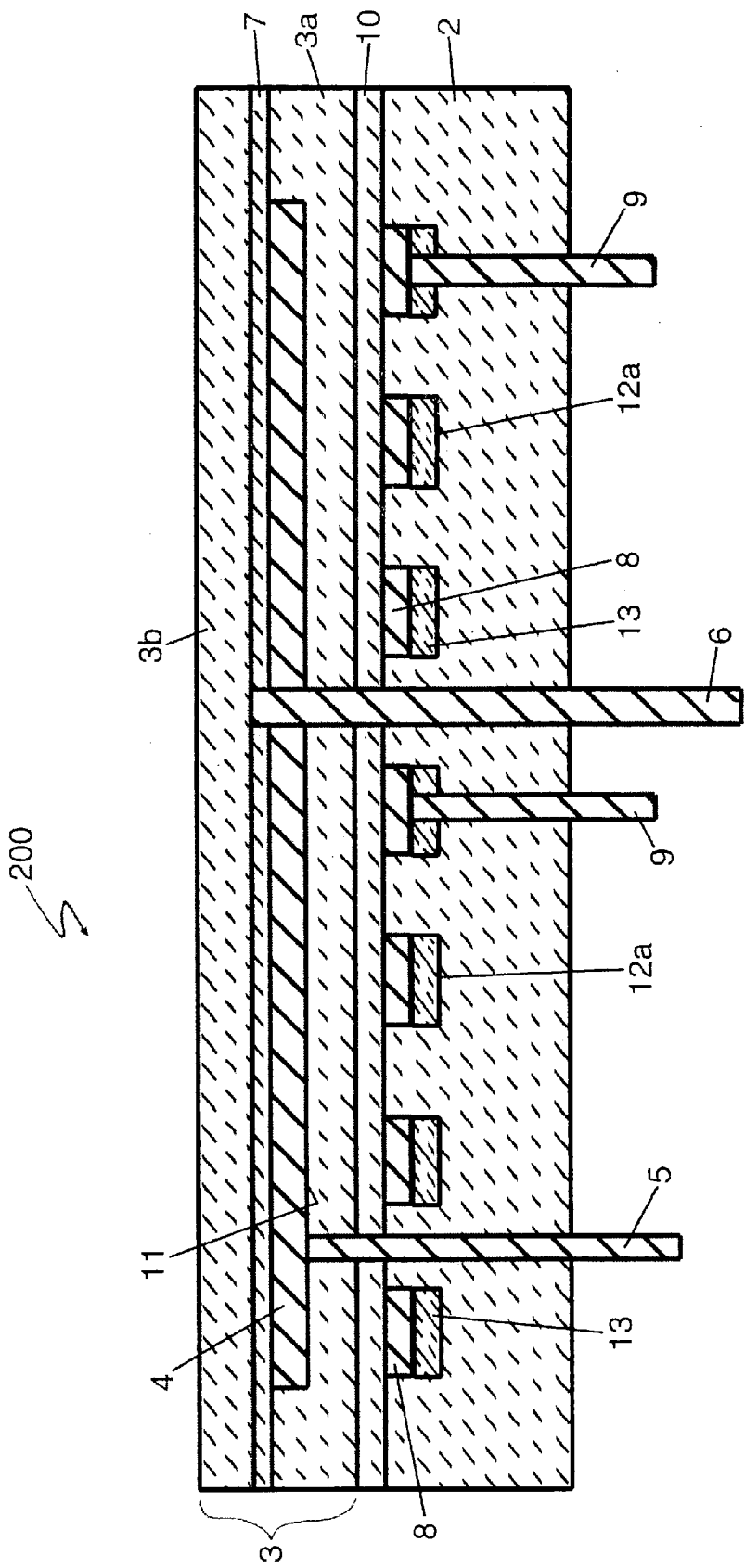
FIG. 3 is a schematic outline showing a cross-sectional view of the structure of the heating apparatus according to a Second Embodiment of the present invention.

The aforementioned heating element 8 and heat insulating material 13 loaded within concave member 12a are installed in the base (i.e., the side onto which the object to be heated is not placed) of heating element 8 of the heating apparatus 200 shown in FIG. 3. The aforementioned concave member 12a is formed deeper than the thickness of heating element 8, at the bonding surface of the loading plate 3 and support plate 2, along the outline of this heating element 8. Within concave member 12, the aforementioned heat insulating material 13 is arranged directly underneath of the heating element 8 along the outline of the concave member 12 and heating element 8.

[Heat Insulating Material]

In the present embodiment, the heat insulating material 13 is provided in a manner loaded within concave member 12, and is thus not exposed to plasma, anti-corrosive gases, or the like. As a result, the material comprising this heat insulating material 13 needs only to have superior heat insulating properties, and does not require superior corrosion resistance, plasma resistance or the like.

Consequently, this heat insulating material 13 may include materials that efficiently insulate the heat emitted from heating element 8, such as any material with a coefficient of thermal conductivity not exceeding 100 W/mK. Examples of materials having such heat insulation properties include, for example, aluminum nitride (coefficient of thermal conductivity: 80 W/mK), silicon nitride (coefficient of thermal conductivity: 30 W/mK), siliceous material such as quartz (coefficient of thermal conductivity: 3 W/mK) and the like, ceramics such as alumina (coefficient of thermal conductivity: 29 W/mK) and the like, metals such as iron (coefficient of thermal conductivity: 80 W/mK), manganese (coefficient of thermal conductivity: 8 W/mK), or multi-porous materials of the same.

Furthermore, in the present embodiment, only a description of the case in which a heat insulating material 13 is provided solely at the base of the heating element 8. However, the present invention is not limited to the aforementioned, as this heat insulating material 13 may also be provided within concave member 12 at both the base and side portions of the aforementioned heating element 8.

[Method for Manufacturing a Heating Apparatus]

In the following the method for manufacturing the aforementioned heating apparatus 200 will be explained. Moreover, the manufacturing method described in the following may also be applied without problems to the case when manufacturing the heating apparatus 100 shown in FIG. 1.

The support plate 2 and loading base plate 3a which possess concave members 12a and 11 on their surfaces, respectively, are formed by means of concave processing of a disk-shaped (or the like) aluminum nitride sintered body or aluminum nitride group sintered body formed according to a conventional method. Subsequently, an electrode plate 4 is formed within concave member 11, which is provided in loading base plate 3a. In addition, the loading head plate 3b may be formed according to a conventional method.

Subsequently, a material having the same composition or same main component as the material comprising loading base plate 3a or loading head plate 3b is inserted in between the aforementioned loading base plate 3a and loading head plate 3b, at their bonding surface. Loading base plate 3a and loading head plate 3b are then bonded via a second bonding layer 8, by means of applying high-temperature pressure to loading base plate 3a and loading head plate 3b, to form the loading plate 3.

For example, in the case when the material comprising loading base plate 3a or loading head plate 3b is aluminum nitride, the aluminum nitride powder is placed onto the bonding surface of loading base plate 3a and loading head plate 3b, and loading base plate 3a and loading head plate 3b are bonded by means of applying high-temperature pressure thereon without the use of another bonding agent.

Subsequently, the heating element 8 and heat insulating material 13, formed according to the aforementioned method (1) for manufacturing heating element 8, are loaded within concave member 12a of support plate 2 in a manner such that the heat insulating material 13 is positioned at the base of heating element 8.

Subsequently, support plate 2 and loading plate 3 are bonded together by means of a first bonding layer 10.

An example of the bonding method for bonding support plate 2 and loading plate 3, in which the aforementioned first bonding layer 10 is formed from an oxynitride glass layer containing a bonding agent comprising at least two elements selected from the elements of Group IIIa of the Periodic Table, aluminum, and silicon will be described in the following.

A finely powdered vitreous bonding agent is first mixed with screen oil to form a paste. This heat-resistant bonding agent is then coated in paste form onto the bonding surfaces of support plate 2, in which heating element 8 is loaded within concave member 12, and loading base plate 3a, and then dried at 100~200° C. The manufacturing method of the vitreous bonding agent used at the time of forming the first bonding layer 10 will be described in detail below.

Subsequently, support plate 2 and loading plate 3 are stacked with heating element 8 sandwiched therein between by means of the surfaces onto which the aforementioned heat-resistant bonding agent has been coated. The aforementioned stacked structure is then heated for 5~40 minutes in an electric furnace at 1300~1500° C., and the vitreous bonding agent, contained in the heat-resistant bonding agent, is melted and then cooled, resulting in the bonding of support plate 2 and loading plate 3 via first bonding layer 10.

In the above-described process, heating of the aforementioned heat-resistant bonding agent (vitreous bonding agent) is conducted under atmospheric pressure or a pressure of no greater than $10^{10}$ kPa.

Moreover, the atmosphere at the time of heating the aforementioned heat-resistant bonding agent (vitreous bonding agent) differs depending on the vitreous bonding agent used. In the case when a vitreous bonding agent containing oxynitride glass is used, since the vitreous bonding agent has been previously treated to form oxynitride, the heating of the aforementioned heat-resistant bonding agent (vitreous bonding agent) may be conducted under a non-nitrogen containing atmosphere. However, even in the case when using a vitreous vitreous bonding agent containing oxynitride glass, in order to further promote the formation of oxynitride, or prevent oxidization of the oxynitride glass, the aforementioned heating of the heat-resistant bonding agent (vitreous bonding agent) is more preferably conducted under a nitrogen-containing atmosphere.

In contrast, in the case when using a vitreous bonding agent containing oxide glass, a nitrogen source is required in order to transform the oxide glass into oxynitride glass, and thus the heating of the heat-resistant bonding agent (vitreous bonding agent) must be conducted under a nitrogen-containing atmosphere. Furthermore, the aforementioned nitrogen-containing atmosphere may be formed by means of using $N_2$ gas, a mixed $H_2$—$N_2$ gas or $NH_3$ gas.

It is possible to bring back the bonding strength by means of cooling and solidifying the molten vitreous bonding agent, however, instead of performing rapid cooling, it is preferable to stabilize the oxynitride glass layer while maintaining a high uptake amount of the nitrogen by means of gradual cooling. Consequently, the cooling rate of the vitreous bonding agent is preferably no greater than 50° C./min, and more preferably no greater than 30° C./min.

Furthermore, the thickness of the aforementioned first bonding layer 10 may be set to within the aforementioned range by means of appropriately adjusting the processing conditions, such as the mixing ratio of the finely powdered vitreous bonding agent and screen oil, coating amount of the heat-resistant bonding agent in paste form, heating temperature at the time of bonding, heating duration, and the like.

Here, an example of the method for manufacturing an appropriate vitreous bonding agent used at the time of forming the first bonding layer 10 comprising an oxynitride glass layer containing a bonding agent comprising at least two elements selected from the elements of Group IIIa of the Periodic Table, aluminum, and silicon, will be described in the following.

To begin with, as the starting material powder of the vitreous bonding agent, for example, oxides comprising at least two elements selected from the elements of Group IIIa of the Periodic Table, silicon dioxide, and aluminum oxide are mixed, or alternatively a compound that is converted into the aforementioned by means of heat treatment is mixed.

This starting material mixed powder is then pulverized to a particle diameter of $5 \times 10^{-6}$ m (5 μm) or less, and melted at 1500~1700° C. Subsequently, the vitreous cooled material obtained by means of rapid cooling of the aforementioned is pulverized to yield a particle diameter of $5 \times 10^{-6}$ m (5 μm) or less, and the bonding agent of this molten fine powder having a uniform composition is then adjusted to yield a vitreous bonding agent.

Furthermore, examples of the elemental oxide of Group IIIa of the Periodic Table, are not particularly limited and may include $Y_2O_3$, $Dy_2O_3$, $Er_2O_3$, $Gd_2O_3$, $La_2O_3$, $Yb_2O_3$, $Sm_2O_3$, and the like.

Among the aforementioned, from the perspective of cost and availability, one of the oxides comprising elements of Group IIIa of the Periodic Table should preferably be $Y_2O_3$, while the other elemental oxide of Group IIIa of the Periodic Table may preferably comprise $Dy_2O_3$, $Er_2O_3$, or $Gd_2O_3$, which are able to easily form an overall solid solution with $Y_2O_3$. In particular, from the perspective of cost, $Dy_2O_3$ is particularly preferred.

In addition, the composition ratios of each aforementioned component are not particularly limited, however, blending a solid solution comprising a total amount of the two or more types of elemental oxides comprising elements selected from Group IIIa of the Periodic Table of 20~50% by weight, silicon dioxide of 30~70% by weight, and aluminum oxide of 10~30% by weight is preferred since such a solid solution has a low melting point and a superior wettability with ceramics and the like.

Furthermore, in the case of two types of elements from Group IIIa of the Periodic Table, it is preferable to blend the aforementioned at a molar ratio of the elemental oxides of Group IIIa of the Periodic Table of 1:1, since this results in a bonding agent with the lowest melting point.

The atmosphere at the time of adjusting this vitreous bonding agent is not particularly limited, such that conducting the aforementioned under a nitrogen atmosphere results in oxynitride glass, while conducting the aforementioned under a non-nitrogen atmosphere results in oxide glass. However, in the present embodiment, since an oxynitride glass layer will be formed in the end, it is preferable to pre-form oxynitride from the vitreous bonding agent by adjusting the vitreous bonding agent under nitrogen atmosphere.

Furthermore, the aforementioned nitrogen-containing atmosphere may be formed by means of using $N_2$ gas, a mixed $H_2$—$N_2$ gas or $NH_3$ gas.

In addition, blending 1~50% by weight of a $Si_3N_4$ powder and/or an AlN powder into the aforementioned vitreous bonding agent is preferred. By means of adding a $Si_3N_4$ powder and/or an AlN powder in this manner, it is possible to decrease the coefficient of thermal expansion of the oxynitride glass and also improve the heat resistance thereof.

Furthermore, in the case when the $Si_3N_4$ powder and/or an AlN powder is blended in an amount less than 1% by weight, it is not possible to obtain the aforementioned effects even with the addition of the $Si_3N_4$ powder and/or an AlN powder. In addition, when the blending amount exceeds 50% by weight, the bonding strength between the support plate 2 and loading plate 3 is reduced, and thus is not desirable.

In addition, the particle diameter of the $Si_3N_4$ powder and/or an AlN powder to be added is not particularly limited, however, from the standpoint of being able to form an oxynitride glass having a uniform concentration, an average particle diameter of no greater than $0.8 \times 10^{-6}$ m (0.8 μm) is preferred.

According to the present embodiment, a heat insulating material 13 is loaded within concave member 12, which is provided on the bonding surface with loading plate 3 of support plate 2 (base member), and thus this heat insulating material 13 is not exposed to anti-corrosive atmospheric gases, plasma, and the like. As a result, it is possible to provide a heating apparatus that can be manufactured easily at low cost with a further improved product life, wherein no limitations exist for the material comprising this heat insulating material 13.

In addition, the heating apparatus 200 of the present embodiment is provided with a heat insulating material 12 at the base of heating element 8 (i.e., the side on which the object to be heated does not rest), and thus it is possible to effectively prevent heat dissipation from the side on which the object to be heated does not rest, while also maintaining the conductivity of the side on which the object to be heated rests. This aspect, in turn, results in a superior heating efficiency.

Furthermore, in the present embodiment, only a structure in which a concave member 12a is provided on the bonding surface with loading plate 3 of support plate 2 (base member), wherein a heat insulating material 13 and heating element 8 are provided in this concave member 12a is described. However, the present invention is not limited to the aforementioned, as long as a structure is realized in which a concave member is provided on the bonding surface of one or both of the support plate 2 and loading plate 3, wherein a heating element and heat insulating material are loaded within said concave member, such that the heat insulating material is arranged either at the base of this heating element, or alternatively at the base and side portions of the aforementioned heating member.

[Third Embodiment]

Figure 4:
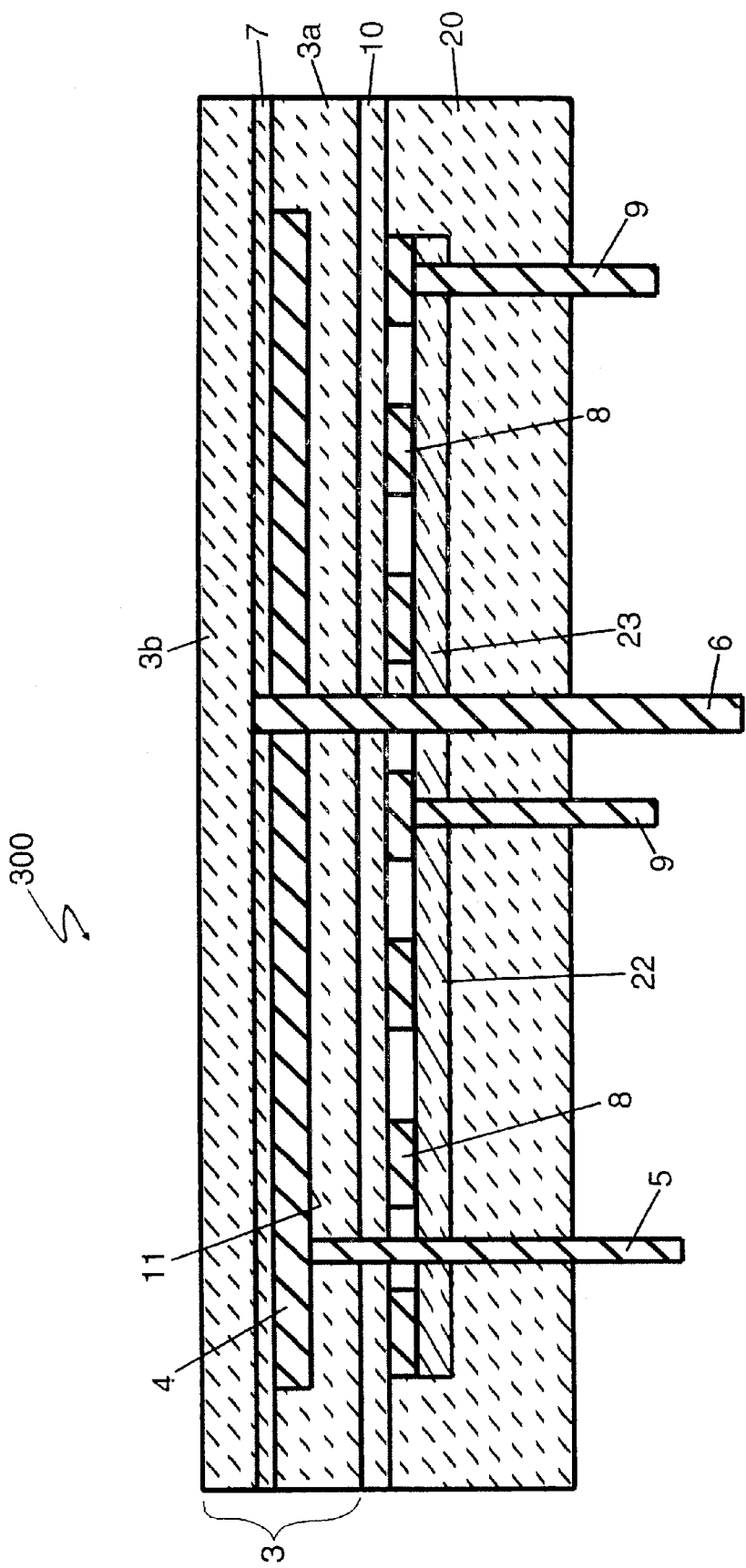
FIG. 4 is a schematic outline showing a cross-sectional view of the structure of the heating apparatus according to a Third Embodiment of the present invention.
Figure 5:
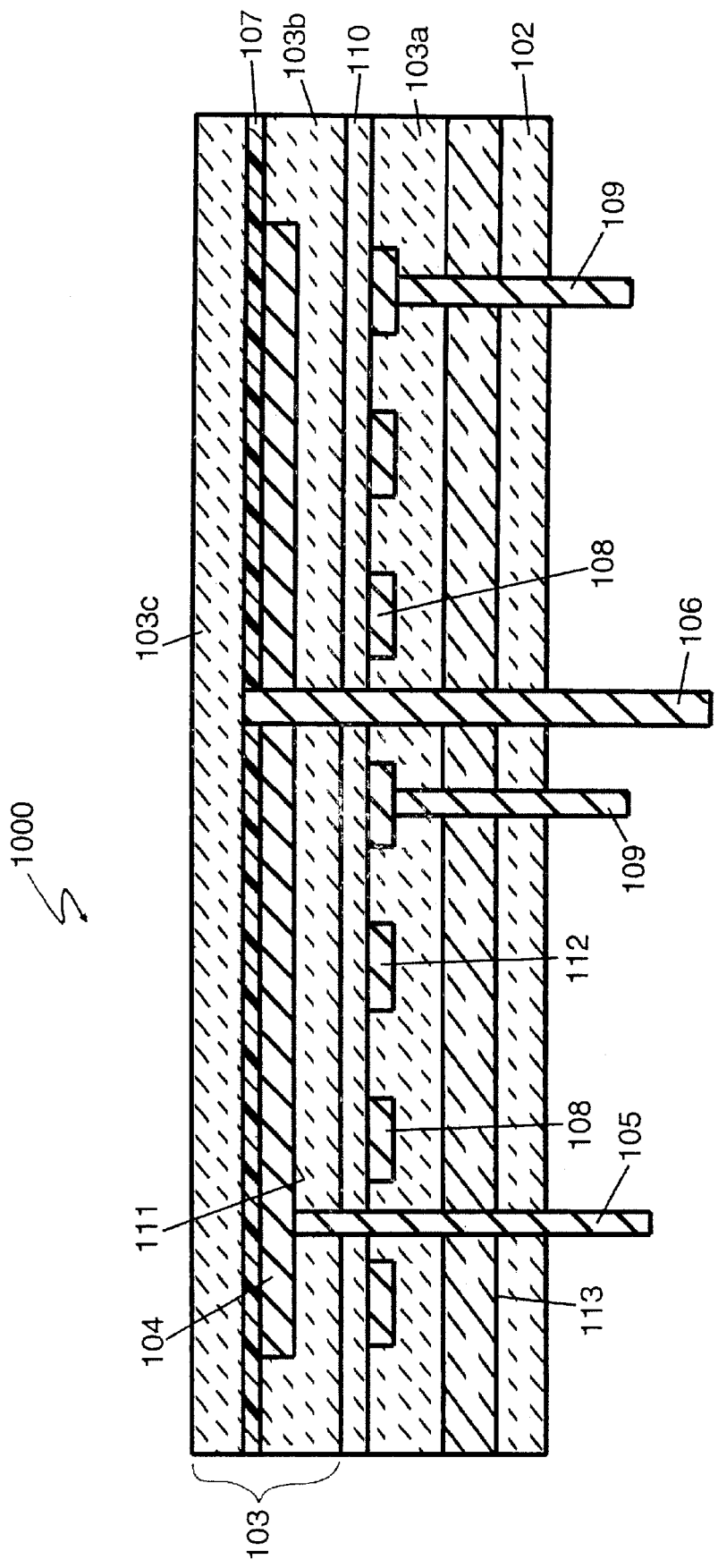
FIG. 5 is a schematic outline showing a cross-sectional view of the structure of a conventional heating apparatus.

In the following, the structure of heating apparatus 300 according to a Third Embodiment of the present invention, a schematic cross-sectional view of which is shown in FIG. 4, will be explained.

The basic structure of the heating apparatus 300 of the present embodiment is the same as that of heating apparatus 200 of the aforementioned Second Embodiment. The only differences are in the shape of the concave member and heat insulating material provided in support plate 2. Consequently, in FIG. 4, the structural components that are identical to those of the aforementioned heating apparatus 200 will be denoted by the same numeral and their explanations will be omitted. In addition, the plane structures of electrode plate 4 and heating element 8 of heating apparatus 300 are identical to those respectively shown in FIGS. 2A and 2B, according to the First Embodiment, and hence their drawings will be omitted.

In FIG. 4, a support plate 20, concave member 22, and heat insulating material 23 are shown.

In the present embodiment, as shown in FIG. 4, a concave member 22 is provided on the upper surface of support plate 2 (i.e., at the bonding surface with loading plate 3) which comprises a surface area larger than that of heating element 8. A heating element 8 having a predetermined shape (e.g., spiral shape) is loaded within this concave member 22.

In addition, a heat insulating material 23 is loaded within this concave member 22 at the base of heating element 8; however, this heat insulating material 23, as shown in FIG. 4, is formed over the entire surface of the base of concave member 22, such that it is provided within concave member 22 over both the area in which heating element 8 is formed and also the area in which heating element 8 is not formed.

Furthermore, in the present embodiment, only the case in which a heat insulating member 23 is solely provided on the base of concave member 22 is shown; however, the present invention is not limited to the aforementioned, as this heat insulating material 23 may also be provided on the base and sides of the aforementioned concave member 22.

In addition, in the present embodiment, the structural materials of support plate 20 and heat insulating material 23 are identical to the respective structural materials of support plate 2 and heat insulating material 13 of the First Embodiment, and heating apparatus 300 may be manufactured in the same manner as heating apparatus 200 of the Second Embodiment.

According to the present embodiment, in the same manner as in the above-described Second Embodiment, a heat insulating material 23 is loaded within a concave member 22, which is provided on the bonding surface with loading plate 3 of support plate 20 (base member), and thus, this heat insulating material 23 is not exposed to anti-corrosive atmospheric gases, plasma, and the like. As a result, it is possible to provide a heating apparatus that can be manufactured easily at low cost with a further improved product life, wherein no limitations exist for the material comprising this heat insulating material 23.

In addition, the heating apparatus 300 of the present embodiment is provided with a heat insulating material 23 at the base of heating element 8, and thus it is possible to effectively prevent heat dissipation from the side on which the object to be heated does not rest, while also maintaining the conductivity of the side on which the object to be heated does rests. This aspect, in turn, results in a superior heating efficiency.

Furthermore, in the present embodiment, only a structure in which a concave member 22 is provided on the bonding surface with loading plate 3 of support plate 20 (base member), wherein a heat insulating material 23 and heating element 8 are provided in this concave member 22 is described. However, the present invention is not limited to the aforementioned, as long as a structure is realized in which a concave member is provided on the bonding surface of one or both of the support plate 20 and loading plate 3, wherein a heating element is loaded within said concave member, and a heat insulating material is loaded within said concave member with said heating element and arranged at least at the base thereof (i.e., the side on which the object to be heated does not rest).

EXAMPLES

In the following, the present invention will be explained using the examples.

Examples 1~3

According the present examples, a heating apparatus was formed having the structure shown in FIG. 1.

In the following, the formation of a support plate 2 having a low coefficient of thermal conductivity and comprising an aluminum nitride group sintered body having a diameter of 220 mm and a thickness of 15 mm, in which a spiral-shaped concave member 12 for loading a heating element 8 with a width of 5 mm and depth of 8 mm is provided, will be described.

An aluminum nitride powder (F-grade powder manufactured by Tokuyama K.K.) having an average particle diameter of $0.6 \times 10^{-6}$ m (0.6 μm) which does not contain $Y_2O_3$, and a silicon carbonate powder (manufactured by Sumitomo Osaka Cement K.K.) having an average particle diameter of $0.03 \times 10^{-6}$ m (0.03 μm) were mixed at a proportional weight ratio of 99.5:0.5 to form a mixed powder. Subsequently, after adding and mixing in isopropyl alcohol as a dispersing agent, this mixed powder was granulated using a spray dryer.

Subsequently, the resultant granules were pressurized and sintered under the conditions of 1850° C. and 19.6 MPa (200 Kg/cm$^2$) to form a disk-shaped sintered body. The resultant disk-shaped sintered body was then ground according to a conventional grinding method to form a support plate 2 comprising the aforementioned spiral-shaped concave member 12.

The coefficient of thermal conductivity was 57.7 W/mK and the coefficient of thermal expansion was $4.7 \times 10^{-6}$ °C. at the time of measuring the coefficient of thermal conductivity and coefficient of thermal expansion of this support plate 2 using a laser flash method and thermal expansion measuring device (TMA), respectively.

On the other hand, a base plate 3a comprising a disk-shaped, aluminum nitride group sintered body having a diameter of 220 mm and a thickness of 8 mm, and a head plate 3b comprising an aluminum nitride group sintered body having a diameter of 220 mm and a thickness of 1 mm were formed according to the aforementioned formation process of support plate 2 with the exception of using a mixed powder comprising the aforementioned aluminum nitride powder, silicon carbonate powder, and yttria powder (manufactured by Nihon yttrium, K.K.) at a weight ratio of 99.5:0.5:3.0.

Upon measuring the coefficient of thermal conductivity of this base plate 3a and head plate 3b according to the aforementioned methods, both displayed an excellent value of 110 W/mK, which was a higher coefficient of thermal conductivity than that of the support plate 2. In addition, upon measuring the coefficient of thermal expansion of this base plate 3a and head plate 3b according to the aforementioned methods, both displayed a value of $4.4 \times 10^{-6}$/°C., which was very close to the coefficient of thermal expansion of the aforementioned support plate 2.

In addition, a heating element 8 was formed, according to the above-described method for manufacturing a heating element 8 (1), comprising a silicon carbonate sintered body having a sintered density of $3.1 \times 10^{-3}$ kg/cm$^3$, and an electrical resistivity of $0.05 \times 10^{-2}$ Ωm, which was sintered without the addition of a sintering auxiliary agent, additives for imparting conductivity, and the like. This heating element 8 was provided with a specific shape and loaded into the aforementioned spiral-shaped concave member 12.

The average particle diameter of the first silicon carbonate powder was $0.7 \times 10^{-6}$ m (0.7 μm) and the addition amount was 95% by weight, while the average particle diameter of the second silicon carbonate powder was $0.01 \times 10^{-6}$ m (0.01 μm) with an addition amount of 5% by weight. The hot press sintering conditions comprised a press pressure of 39.2 MPa (400 kg/cm$^2$), sintering temperature of 2200° C., and a sintering duration of 90 minutes.

On the other hand, a coating agent containing a tungsten powder having an average particle diameter of $0.5 \times 10^{-6}$ m (0.5 μm), and a commercially available screen oil was screen printed onto the base plate in the shape of an electrode. In addition, a coating agent containing an aluminum nitride powder and a commercially available screen oil was screen printed onto the base plate 3a, over the remaining area other than that of the aforementioned electrode.

Subsequently, base plate 3a and head plate 3b were first stacked and joined by means of the aforementioned screen-printed surface, and then heat-treated under the conditions of 1800° C. and 7.35 MPa (75 kg/cm$^2$) to form an integrated body. The tungsten electrode plate was hence sandwiched between the base plate 3a and head plate 3b, thereby forming the loading plate 3.

Thereafter, a vitreous, heat-resistant bonding agent (average particle diameter of approximately $2 \times 10^{-6}$ m (approximately 2 μm)) having the composition shown in Table 1 was mixed with a commercially available screen oil to form a paste. This vitreous, heat-resistant bonding agent 10 in paste form was coated onto the respective bonding surfaces of the aforementioned support plate 2, comprising a ceramics sintered body onto which the aforementioned heating element 8 was loaded within the aforementioned spiral-shaped concave groove 12, and loading plate 3, comprising a ceramics sintered body, and then dried at 100~200° C.

Subsequently, the aforementioned support plate 2 and loading plate 3 were stacked by means of the aforementioned surfaces onto which the vitreous, heat-resistant bonding agent 10 had been coated, with the aforementioned heating element 8 sandwiched therein between. In this manner, the aforementioned support plate 2 and loading plate 3 were bonded together in an airtight manner by means of heating within an electric furnace possessing an $N_2$ gas atmosphere and melting the vitreous, heat-resistant bonding agent at 1450° C. for 20 minutes. The cooling rate was 25° C./min, and the thickness of the bonding layer 10 after bonding was 50 μm. In addition, the formation of oxynitride glass on the bonding interface was confirmed by means of Auger electron spectral analysis.

With respect to the resultant heating apparatus 100 of Examples 1~3, each was subjected to a durability test in order to confirm the air-tightness of the bonding portion of the aforementioned support plate 2, comprising an aluminum nitride group sintered body, and base plate 3a, comprising an aluminum nitride group sintered body.

In addition, upon examining the bonding interface of the base plate 3a and head plate 3b with an SEM microscope, it was confirmed that the base plate 3a and head plate 3b were well bonded into a single body.

[Durability Test]

Electricity was passed through the heating apparatus 100, and the temperature was increased over the course of one hour from room temperature to a maximum temperature of 700° C. After maintaining this maximum temperature for 30 minutes, the temperature was gradually lowered back to room temperature. The air-tightness of the aforementioned bonding portion after loading this heat cycle 100 times was then measured by means of a leak test using He gas.

Furthermore, the air-tightness was evaluated according to the evaluation standard shown below.

○: The leakage amount of He was less than $1.33 \times 10^{-7}$ Pa/sec.

Δ: The leakage amount of He was $1.33 \times 10^{-7}$ Pa/sec~$1.33 \times 10^{-6}$ Pa/sec.

×: The leakage amount of He was greater than $1.33 \times 10^{-6}$ Pa/sec.

The results of the durability test are shown in Table 1.

TABLE 1

| | Composition of the bonding agent starting material powder (% by wt) | | | | |
|---|---|---|---|---|---|
| | $Dy_2O_3$ | $Y_2O_3$ | $Al_2O_3$ | $SiO_2$ | Air-tightness |
| Example 1 | 15 | 10 | 25 | 50 | ○ |
| Example 2 | 15 | 15 | 25 | 45 | ○ |
| Example 3 | 15 | 15 | 20 | 50 | ○ |

Example 4

According the present example, a heating apparatus containing a heat insulating material was formed having the structure shown in FIG. 3.

In the following, the formation of a support plate 2 comprising an aluminum nitride group sintered body having a diameter of $220 \times 10^{-3}$ m (220 mm) and a thickness of $15 \times 10^{-3}$ m (15 mm), in which a spiral-shaped concave member 12a for loading a heating element 8 with a width of $5 \times 10^{-3}$ m (5 mm) and depth of $8 \times 10^{-3}$ m (8 mm) is provided, will be described.

An aluminum nitride powder (F-grade powder manufactured by Tokuyama K.K.) having an average particle diameter of $0.6 \times 10^{-6}$ m (0.6 μm) which did not contain yttria, and a silicon carbonate powder (manufactured by Sumitomo Osaka Cement K.K.) having an average particle diameter of $0.03 \times 10^{-6}$ m (0.03 μm) were mixed at a proportional weight ratio of 99.5:0.5 to form a mixed powder. Subsequently, after adding and mixing in isopropyl alcohol as a dispersing agent, this mixed powder was granulated using a spray dryer.

Subsequently, the resultant granules were pressurized and sintered under the conditions of 1850° C. and 19.6 MPa (200 Kg/cm²) to form a disk-shaped sintered body.

The resultant disk-shaped sintered body was then ground according to a conventional grinding method to form a support plate 2 comprising the aforementioned spiral-shaped concave member 12a (depth $8 \times 10^{-3}$ m (8 mm)).

On the other hand, a loading base plate 3a comprising a disk-shaped, aluminum nitride group sintered body having a diameter of $220 \times 10^{-3}$ m (220 mm) and a thickness of $8 \times 10^{-3}$ m (8 mm), on the surface of which a concave member having a diameter of $200 \times 10^{-3}$ m (200 mm) and a depth of $0.03 \times 10^{-3}$ m (0.03 mm) is provided; and a loading head plate 3b comprising an aluminum nitride group sintered body having a diameter of $220 \times 10^{-3}$ m (220 mm) and a thickness of $1 \times 10^{-3}$ m (1 mm) were formed according to the aforementioned formation process of support plate 2 with the exception of using a mixed powder comprising the aforementioned aluminum nitride powder, silicon carbonate powder, and yttria powder (manufactured by Nihon Yttrium, K.K.) at a weight ratio of 99.5:0.5:3.0.

In addition, a heating element 8 was formed, according to the above-described method for manufacturing a heating element 8 (1), comprising a silicon carbonate sintered body having a sintered density of $3.1 \times 10^{-3}$ kg/cm³, and an electrical resistivity of $0.05 \times 10^{-2}$ Ωm, which was sintered without the addition of a sintering auxiliary agent, additives for imparting conductivity, and the like. This heating element 8 was provided with a specific shape (clearance $1 \times 10^{-3}$ m (1 mm)) and thickness of $4 \times 10^{-3}$ m (4 mm) to be loaded into the aforementioned spiral-shaped concave member 12a.

The average particle diameter of the first silicon carbonate powder was $0.7 \times 10^{-6}$ m (0.7 μm) and the addition amount was 95% by weight, while the average particle diameter of the second silicon carbonate powder was $0.01 \times 10^{-6}$ m (0.01 μm) with an addition amount of 5% by weight. The hot press sintering conditions comprised a press pressure of 39.2 MPa (400 kg/cm²), sintering temperature of 2200° C., and a sintering duration of 90 minutes.

On the other hand, a coating agent containing a tungsten powder, having an average particle diameter of $0.5 \times 10^{-6}$ m (0.5 μm), and a commercially available screen oil was screen printed in the shape of an electrode within the concave member 11 provided on the surface of loading base plate 3a to form a tungsten electrode plate 4.

In addition, a bonding agent containing the aforementioned aluminum nitride powder and a commercially available screen oil was screen printed onto the surface of loading base plate 3a, over the remaining area on which the aforementioned electrode plate 4 was not formed.

Subsequently, loading base plate 3a and loading head plate 3b were first stacked and joined by means of the aforementioned screen-printed surface, and then heat-treated under the conditions of 1800° C. and 7.35 MPa (75 kg/cm²). The aforementioned loading base plate 3a and loading head plate 3b were hence bonded into an integrated body by means of a second bonding layer 7 formed from aluminum nitride to form a loading plate 3, in which the tungsten electrode plate 4 was sandwiched between the base plate 3a and head plate 3b.

On the other hand, a heat insulating material 13 (thickness $2\times10^{-3}$ m (2 mm) and clearance of $1\times10^{-3}$ m (1 mm)) possessing a shape formed by means of loading into a spiral-shaped concave member 12a provided in support plate 2, and comprising a silicon nitride sintered body, was formed according to a grinding method.

Subsequently, the heating element 8 and heat insulating material 13 were loaded into the spiral-shaped concave member 12a provided in support plate 2, with the heat insulating material 13 positioned at the base of the heating element 8.

Thereafter, a vitreous, heat-resistant bonding agent ($SiO_2$—$Dy_2O_3$—$Al_2O_3$—$Y_2O_3$ type agent with an average particle diameter of approximately $2\times10^{-6}$ m (2 μm)) was mixed with a commercially available screen oil to form a paste. This vitreous, heat-resistant bonding agent 10 in paste form was coated onto the respective bonding surfaces of the aforementioned support plate 2, and loading plate 3 (loading base plate 3a) and then dried at 100~200° C.

Subsequently, the aforementioned support plate 2 and loading plate 3 were stacked by means of the aforementioned surfaces onto which the vitreous, heat-resistant bonding agent 10 had been coated, with the aforementioned heating element 8 and heat insulating material 13 sandwiched therein between. In this manner, the aforementioned support plate 2 and loading plate 3 were bonded together in an airtight manner by means of heating within an electric furnace possessing an $N_2$ gas atmosphere, melting the vitreous, heat-resistant bonding agent at 1450° C. for 20 minutes, and then cooling. The cooling rate was 25° C./min.

The thickness of the first bonding layer after bonding was $50\times10^{-6}$ m (50 μm). In addition, the formation of oxynitride glass on the first bonding layer was confirmed by means of Auger electron spectral analysis.

What is claimed is:

1. A heating apparatus comprising:

a loading plate on which an object to be heated is placed;

a support plate that is integrated into a single body with said loading plate;

a heating element that is sandwiched in between said loading plate and said support plate; and at least one pair of electrodes, one terminal of which is connected to said heating element;

wherein, said loading plate and said support plate each respectively comprises a ceramics sintered body; said heating element is loaded onto a concave member provided at the bonding surface of at least one of said loading plate and said support plate; and said heating apparatus is further equipped with a heat insulating material arranged at least at the base of said heating element.

2. A heating apparatus comprising:

a loading plate on which an object to be heated is placed;

a support plate that is integrated into a single body with said loading plate;

a heating element that is sandwiched in between said loading plate and said support plate; and at least one pair of electrodes, one terminal of which is connected to said heating element;

wherein, said loading plate and said support plate each respectively comprises a ceramics sintered body, such that the coefficient of thermal conductivity of said ceramics sintered body comprising said loading plate is greater that the coefficient of thermal conductivity of said ceramics sintered body comprising said support plate, said heating element is loaded within a concave member provided at the bonding surface of at least one of said loading plate and said support plate, and said heating apparatus is further equipped with a heat insulating material arranged at least at the base of said heating element.

3. The heating apparatus according to claims 1 or 2, wherein said heat insulating material is selected from the group consisting of a metal and ceramics.

4. The heating apparatus as in one of claims 1 or 2, wherein said ceramics sintered body comprises an aluminum nitride sintered body using $Y_2O_3$ as an auxiliary agent.

5. A heating apparatus according to claim 4, wherein the $Y_2O_3$ blending amount of said ceramics sintered body of said loading plate is greater than the $Y_2O_3$ blending amount of said ceramics sintered body of said support plate.

6. The heating apparatus as in one of claims 1 or 2, wherein said loading plate and said support plate are bonded together into a single body by means of a vitreous bonding layer.

7. A heating apparatus as in one of claims 1 or 2, wherein said loading plate comprises a head plate and a base plate, and is further equipped with an electrode plate sandwiched between said head plate and said base plate, and an electrode connected to said electrode plate.

8. The heating apparatus according to claim 3, wherein said heat insulating materials are selected from the group consisting of aluminum nitride, silicon nitride, a siliceous material, and alumina.

9. The heating apparatus as in one of claims 1 or 2, wherein said ceramics sintered body comprises an aluminum nitride group sintered body using $Y_2O_3$ as an auxiliary agent.

10. The heating apparatus according to claim 9, wherein the $Y_2O_3$ blending amount of ceramics sintered body of said loading plate is greater than the $Y_{23}$ blending amount of said ceramics sintered body of said support plate.

* * * * *